United States Patent [19]

Kohno

[11] Patent Number: 5,754,407
[45] Date of Patent: May 19, 1998

[54] PART HOLDER

[75] Inventor: Takashi Kohno, Sakado, Japan

[73] Assignee: Uniden Corporation, Tokyo, Japan

[21] Appl. No.: 633,707

[22] Filed: Apr. 17, 1996

[30] Foreign Application Priority Data

Dec. 20, 1995 [JP] Japan .................. 7-332331

[51] Int. Cl.$^6$ .................................................. H05K 1/18
[52] U.S. Cl. .................... 361/760; 361/760; 361/767; 361/807; 361/808; 361/809; 361/810
[58] Field of Search .................... 361/760, 767, 361/807, 808, 809, 810

[56] References Cited

U.S. PATENT DOCUMENTS 5,426,265  6/1995  Savage, Jr. .................. 174/138

FOREIGN PATENT DOCUMENTS

| 58-109186 | 7/1983  | Japan . |
| 58-113287 | 8/1983  | Japan . |
| 59-52584  | 4/1984  | Japan . |
| 1-134387  | 9/1989  | Japan . |
| 5-73890   | 10/1993 | Japan . |

*Primary Examiner*—Leo P. Picard
*Assistant Examiner*—David Foster
*Attorney, Agent, or Firm*—McDermott, Will & Emery

[57] ABSTRACT

A part holder comprises a groove into which one terminal of a part is inserted, and in a cross section of the groove, there are at least two projecting peaks in one side, one projecting peak in the other side of the holder which is positioned at center between the two projecting peaks. The distance between a line linking vertexes of the two projecting peaks in the one side of the groove and a vertex of the one projecting peak in the other side of the groove is shorter than the diameter or width of the terminal of the part.

8 Claims, 3 Drawing Sheets

5,754,407

PART HOLDER

FIELD OF THE INVENTION

The present invention relates to a part holder used for part mounting on a substrate, and more particularly to a part holder which can prevent parts mounted on a substrate from rising when dipped into a soldering bath and also can reduce dimensional tolerance in height of the parts on the substrate.

BACKGROUND OF THE INVENTION

Conventionally, when electronic parts or the like are mounted on a substrate, some of them are mounted with a holder for the purpose of adjusting the mounting height of parts on the substrate or preventing the parts from rising when dipped into a soldering bath.

FIG. 3 shows an example of the conventional construction of part holder, and is a cross-sectional view showing a case where an LED (light emitting Diode) having a lens thereon is mounted on a substrate with a holder. In this figure, the part designated at the reference numeral 301 is an LED holder, at 302 an LED, at 303 a lens, at 304 a substrate, at 311 a terminal of the LED, at 323 a claw for temporally fixing the LED holder 301 to the substrate 304, at 324 a projection for positioning the LED holder 301, and at 325 a claw for preventing the LED 302 from its rising.

Namely, in the LED holder 301 based on conventional technology, the mounting height of the LED 302 from the substrate 304 mainly depends on the height of the LED holder 301, and the LED 302 is prevented by the claw 325 from rising from the substrate 304 when dipped into a soldering bath.

However, in the LED holder 301 based on the conventional technology, the dimensional tolerance due to nonuniformity in a seat section of the LED 302 produced during manufacturing is relatively large (±0.3 mm). Consequently, a clearance dn inevitably exists between the claw 325 and a seat section of the LED 302, and becomes a cause of the LED 302 rising when dipped into a soldering bath. The spring construction of the claw 325 can not easily be formed, and can be easily broken because of its thin arm.

Also due to dimensional tolerance produced during manufacturing, or to rising of the LED 302 when it is dipped into a soldering bath, there exists clearance variation (in a range from approx. 0.5 to 0.6 mm) between the LED 302 and the lens 303, which in turn induces a nonuniformity in visual illuminance of the LED 302 via the lens 303.

SUMMARY OF THE INVENTION

It is an object of the present invention to provide a part holder which can prevent parts mounted on a substrate from rising when dipped into a soldering bath and also can reduce dimensional variation in height of the parts from the substrate.

As described above, the part holder according to the first feature of the present invention has at least one groove into which one terminal of the part is inserted, and in a cross section of the groove, there are at least two projecting peak in one side, one projecting peak in the other side of the holder which is positioned at center between the two projecting peaks. The distance between a line linking vertexes of the two projecting peaks in the one side of the groove and a vertex of the projecting peak in the other side of the groove is shorter than the diameter or width of the terminal of the part. Hence, when the terminal of the parts is inserted into the groove of the part holder, a bending force is applied to the terminal of the part at the peaks in a direction substantially vertical to the direction in which the terminal of the part is inserted. The terminal is accordingly fixed on the part holder because of friction and spring force due to elasticity of the terminal itself. This makes it possible to prevent the part from rising from the substrate when dipped into a soldering bath, and also to reduce the mounting variation in height. For this reason, it is possible to provide a part holder which can achieve considerably small dimensional variation in height of the part mounting on the substrate.

With the part holder according to the second feature of the present invention, in a cross section of the part holder forming a groove, the distance between one side of the holder and the other side of the groove is kept so wide enough that a part terminal can be easily inserted. And sufficient strength can be given to the construction of molding tool, resulting in reduction of the manufacturing cost of a part holder without any loss caused by molding defect, and also to provide a part holder having a stable outer dimension.

Other objects and features of this invention will become understood from the following description with reference to the accompanying drawings.

BRIEF DESCRIPTION OF THE DRAWINGS

FIGS. 2A and 2B are cross-sectional construction views showing a part holder according to another embodiment of the present invention, wherein FIG. 2A is a cross-sectional construction view when viewed from one side, and FIG. 2B is a cross-sectional construction view when viewed from the front.

DESCRIPTION OF THE PREFERRED EMBODIMENTS

A detailed description is made hereinafter for outline as well as for embodiments of the part holder according to the present invention with reference to related drawings.

Figure 1:
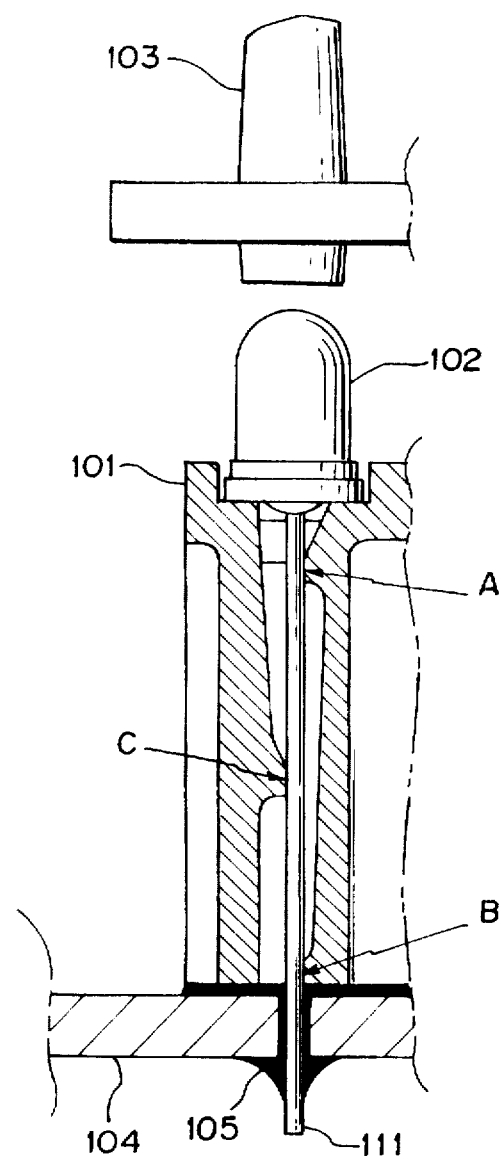
FIG. 1 is a cross-sectional construction view showing a part holder according to one embodiment of the present invention.

The part holder according to the first feature of the present invention is, as shown in FIG. 1, part holder 101 for adjusting the height of the part 102 from the substrate 104 with a groove into which at least one terminal 111 of the part 102 is inserted. In the cross section of the part holder 101 forming the groove, there are at least two projecting peaks A and B in one side, and there is also the projecting peak C in another side between the projecting peaks A and B provided in a direction d in which the terminal 111 of a part is inserted. The distance between a line linking vertexes of the two projecting peaks A and B in the one side of the groove and a vertex of the projecting peak C in another side of the groove is shorter than the diameter or width of the terminal 111 of the part.

For this reason, when the terminal 111 of the part 102 is inserted into the groove of the part holder 101, a bending force is applied to the terminal 111 of the part at the peaks A, B and C in a direction substantially vertical to the direction in which the terminal 111 is inserted. The terminal 111 is accordingly fixed on the part holder 101 because of friction and spring force due to elasticity of the terminal 111 itself. With this feature, the part 102 does not rise from the substrate when dipped into a soldering bath, and the height of the part 102 from the substrate 104 is reduced the mounting variation in height. This makes it possible to realize a part holder which can achieve considerably small dimensional tolerance in height of the part 102 mounting on the substrate 104.

The part holder according to the second feature of the present invention is formed, as shown in FIG. 1, so that the distance between one side and the other side of the groove is kept so wide enough that a part terminal can be easily inserted.

Molding of the groove of the part holder 101 is carried out with a mold construction having the groove described above and the strength of the mold construction is taken into consideration. The durability of the mounting tool is found to be sufficient, resulting in reduction of the manufacturing cost of part holder 101 and at the same time to stabilize outer dimensions of the part holder 101.

FIG. 1 is a cross-sectional construction view showing a part holder according to one embodiment of the present invention. The part holder according to the embodiment shown in the figure is an LED holder in which a part to be mounted is an LED having a lens above the holder, and the figure is a cross-sectional construction view showing a case where the LED is mounted on the substrate with the LED holder.

In the figure, designated at the reference numeral 101 is an LED holder, the material of which is ABS (acrylic.butyl.styrene), at 102 a LED, at 103 a lens, the material of which is an acrylic, at 104 a substrate, at 105 solder, and at 111 a terminal of the LED 102.

The LED 102 is mounted on the LED holder 101 by inserting the terminal 111 of the LED 102 into the groove in the LED holder 101. In a cross section of the part holder 101 shown in FIG. 1, there are at least two projecting peaks A and B in one side, and over the terminal 111 of the LED 102, there is also a projecting peak C in another side between the projecting peaks A and B provided in a direction in which the terminal 111 of the part is inserted. The distance between a line linking vertexes of the two projecting peaks A and B in the one side of the groove and a vertex of the projecting peak C in other side of the groove is shorter than the diameter or width of the terminal 111 of the LED 102. It should be noted that the shape of each of the projecting peaks A, B, and C is formed so that the terminal 111 of the LED 102 can easily be inserted thereinto, and also inclination of the upper side is not so sharp as that of the lower inclination.

For this reason, when the terminal 111 of the LED 102 is inserted into a groove of the LED holder 101, a bending force is applied to the terminal 111 of the LED 102 at the sections thereof contacting the projecting peaks A, B, and C in a direction substantially vertical to the direction in which the terminal 111 of the LED 102 is inserted. The terminal 111 thus is temporarily fixed to the LED holder 101 because of friction and spring force of the terminal 111 itself.

To express the spring force with exemplary concrete numerical values, the width of the terminal 111 of LED 102 is 0.5 mm, the dimensional variation thereof is ±0.03 mm, the distance between a line linking vertexes of the projecting peaks A and B and a vertex of the projecting peak C is 0.45 mm, and a dimensional variation is ±0.03 mm. Assuming in computing that a friction factor at the sections thereof contacting the projecting peaks A, B, and C is approx. 0.3, a bending force at the contacting section thereof is about 20 to 30 gf, which is far greater than the weight (approx. 0. 5 g) of the LED 102 itself, and it is found that the spring force is strong enough to temporarily fix the LED 102.

As described above, after the LED 102 has been temporarily fixed to the LED holder 101, system control goes to a process where the substrate 104 is dipped to solder. The LED 102 is temporarily fixed to the LED holder 101 with a sufficient spring force, and the LED holder 101 itself is also fixed to the substrate 104 with claws for fixing (not shown herein), so that both of them are soldered without rising from the substrate with the solder 105.

As described above, the LED holder 101 according to the embodiment is excellent in workability for mounting because the terminal 111 of the LED 102 is easily inserted thereinto, and can also securely prevent the LED 102 from rising from the substrate when dipped into soldering bath. This applies not only in soldering in an automatic manufacturing line, but also in manual soldering, because the LED 102 is temporarily fixed to the LED holder 101. It is not necessary to manually fix the LED 102 during soldering, and this makes it possible to improve production efficiency.

As for the height of the LED 102 from the substrate 104, a clearance dn, which should be taken into consideration in the conventional technology, is not required to be taken into consideration, and only the dimensional variation of the LED 102 itself should be considered for the section. More particularly, the dimensional variation of light emitting section in the upper section from the seat section of LED 102 is approx. ±0.3 mm. As a result, it is possible to realize an LED holder 101 which can further reduce the dimensional variation of the LED 102 in height from the substrate 104.

As a result, a distance variation between the LED 102 and the lens 103 can be minimized, which makes it possible to reduce nonuniformity in visual illuminance of the LED 102 via the lens 103. And further, because the distance between the LED 102 and the lens 103 is quite constant, it is possible to design the clearance between the LED 102 and the lens 103 to be narrower, which makes it possible to enhance visual illuminance of the LED 102.

As shown in FIG. 1, the cross section of the LED holder 101 forming the groove is formed so that the distance between one side and the other side of the groove is sufficiently wide (concretely approx. 1.5 mm to a width of 0.5 mm of the terminal 111 of LED 102 thereof) in a direction in which the terminal 111 of the LED 102 is inserted.

The LED holder 101 is formed with a mold construction having the cross section of the groove as shown in FIG. 1. However, the width of the groove is not locally narrowed in the embodiment, so that strength of the molding tool construction is well considered. As a result, no problem is found any loss causes by molding defect resulting in reduction of the manufacturing cost of the LED holder 101, and to stabilize an outer dimension of the holder.

Figure 2:
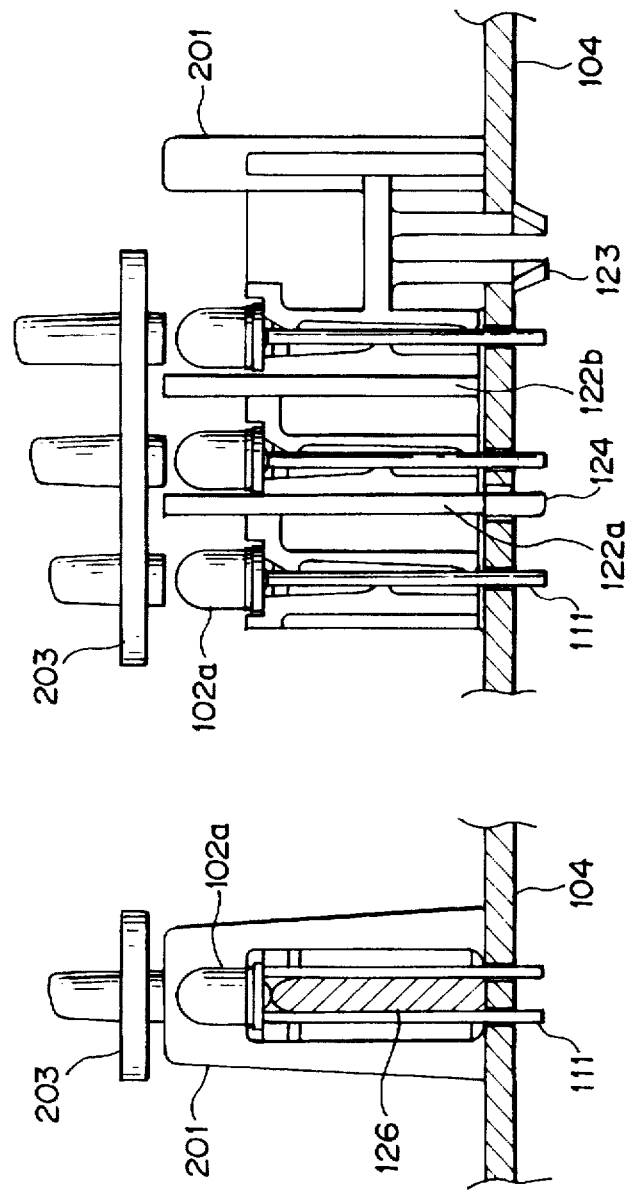
Figure 3:
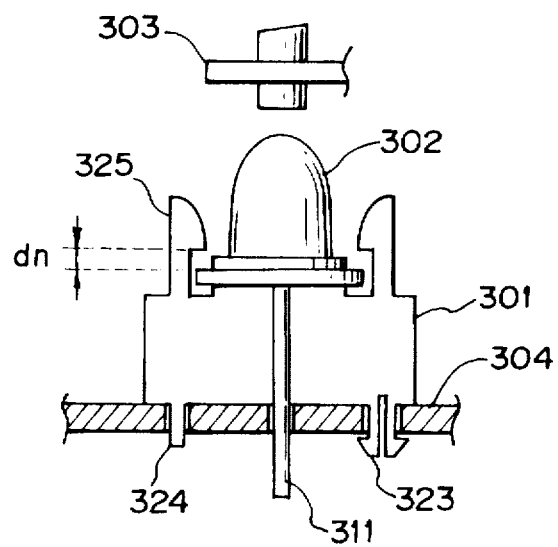
FIG. 3 is a cross-sectional construction view showing a conventional type of LED holder.

FIGS. 2A and 2B are cross-sectional construction views showing a part holder according to another embodiment of the present invention. The part holder in the embodiment is an LED holder for a 3-line LED each having a lens above the holder as in the embodiment described above. FIG. 2A is a cross-sectional construction view from one side in a case where an LED is mounted on a substrate via an LED holder, and FIG. 2B is a cross-sectional construction view from the front.

In the figures, the part designated at the reference numeral 201 is a 3-line LED holder, at 102 is a LED, at 203 is a lens, at 104 is a substrate, at 111 is a terminal of the LED 102, at 122a and 122b each is a partition to prevent light interference to the LEDs from each other, at 123 is a claw to temporarily fix the 3-line LED holder 201 to the substrate 104, at 124 is a projecting boss for positioning of the 3-line LED holder 201, and at 126 is a guide rib when inserting the terminal 111 of the LED 102a thereinto.

The basic configuration of the 3-line LED holder 201 is the same as that of the LED holder 101 in the embodiment described above. Accordingly, rising of the LED 102a can be prevented when dipped into a soldering bath, and also it is possible to further reduce the mounting variation in height. Also the distance between the LED 102a and the lens 203 can be kept constant, which makes it possible to reduce nonuniformity in visual illuminance of the LED 102a via the lens 203. Particularly, in the 3-line configuration as that in the embodiment, nonuniformity in illuminance becomes remarkable because of synergistic effect, so that an advantage provided by this construction is great.

It should be noted that the LED holder according to the present invention is not limited to an LED holder, but can be applied to various types of electronic part such as a light emitting numeric segment display and a photo-coupler which is required precise positioning.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A holder for adjusting the height of a part from a substrate, comprising:

at least one groove into which at least one terminal of said part is inserted;

at least two projecting portions formed on an inner surface of said at least one groove; and at least a third projecting portion, located between said at least two projecting portions, formed on another inner surface of said at least one groove and provided in a direction in which the at least one terminal of said part is inserted, wherein a distance d is shorter than a diameter or width of the at least one terminal of said inserted part.

2. A holder according to claim 1, wherein a width of said groove is adjustable.

3. A structure for carrying an electronic component fixed to a substrate, comprising:

a supporting element having a groove configured for receiving a terminal of said electronic component; and at least one projecting portion formed on an inner surface between at least two other projecting portions formed on another inner surface of said groove so as to accommodate said terminal tightly and establish a prescribed distance between said electronic component and said substrate.

4. The structure of claim 3, further comprising a holding portion for accommodating said electronic component so as to establish a prescribed alignment of said electronic component with respect to other elements mounted on said substrate.

5. The structure of claim 3, wherein said supporting element is made of acrylic-butyl-styrene.

6. The structure of claim 3, wherein said electronic component is soldered to said substrate.

7. A light-emitting device, comprising:

a light-emitting diode having a terminal mounted on a substrate;

a lens positioned above said light-emitting diode to direct light emitted by said light-emitting diode; and a light-emitting diode holding element having a groove configured for receiving said terminal and at least one projecting portion formed on an inner surface between at least two other projecting portions formed on another inner surface of said groove for accommodating said terminal tightly so as to hold said light-emitting diode at a prescribed distance form said substrate and from said lens.

8. The device of claim 7, wherein said lens is made of acrylic material, and said light-emitting diode holding element is made of acrylic-butyl-styrene.

* * * * *